United States Patent
Biloiu et al.

(10) Patent No.: US 11,361,935 B2
(45) Date of Patent: Jun. 14, 2022

(54) APPARATUS AND SYSTEM INCLUDING HIGH ANGLE EXTRACTION OPTICS

(71) Applicant: Applied Materials, Inc., Santa Clara, CA (US)

(72) Inventors: Costel Biloiu, Rockport, MA (US); Jay R. Wallace, Danvers, MA (US); Kevin M. Daniels, Lynnfield, MA (US); Frank Sinclair, Boston, MA (US); Christopher Campbell, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/092,250

(22) Filed: Nov. 7, 2020

(65) Prior Publication Data
US 2022/0148843 A1    May 12, 2022

(51) Int. Cl.
*H01J 37/08*    (2006.01)
*H01J 37/32*    (2006.01)

(52) U.S. Cl.
CPC ........ *H01J 37/08* (2013.01); *H01J 37/32559* (2013.01)

(58) Field of Classification Search
CPC ............................ H01J 37/08; H01J 37/32559
See application file for complete search history.

(56) References Cited

U.S. PATENT DOCUMENTS

| | | |
|---|---|---|
| 9,514,912 B2 | 12/2016 | Biloiu et al. |
| 2012/0104274 A1 | 5/2012 | Hirayanagi et al. |
| 2016/0189935 A1 | 6/2016 | Biloiu et al. |
| 2016/0333464 A1 | 11/2016 | Likhanskii et al. |
| 2017/0032927 A1 | 2/2017 | Koo et al. |
| 2021/0035779 A1 | 2/2021 | Biloiu et al. |

FOREIGN PATENT DOCUMENTS

| | | |
|---|---|---|
| JP | 2016081753 A | 5/2016 |
| WO | 2020117939 A1 | 6/2020 |

OTHER PUBLICATIONS

International Search Report and Written Opinion dated Jan. 7, 2022, for the International Patent Application No. PCT/US2021/051002, filed on Sep. 18, 2021, 9 pages.
International Search Report and Written Opinion dated Sep. 17, 2021, for the International Patent Application No. PCT/US2021/032727, filed on May 17, 2021, 9 pages.

*Primary Examiner* — Nicole M Ippolito
*Assistant Examiner* — Hanway Chang
(74) *Attorney, Agent, or Firm* — KDB (57) ABSTRACT

An extraction plate for an ion beam system. The extraction plate may include an insulator body that includes a peripheral portion, to connect to a first side of a plasma chamber, and further includes a central portion, defining a concave shape. As such, an extraction aperture may be arranged along a first surface of the central portion, where the first surface is oriented at a high angle with respect to the first side. The extraction plate may further include a patterned electrode, comprising a first portion and a second portion, affixed to an outer side of the insulator body, facing away from the plasma chamber, wherein the first portion is separated from the second portion by an insulating gap.

20 Claims, 8 Drawing Sheets

APPARATUS AND SYSTEM INCLUDING HIGH ANGLE EXTRACTION OPTICS

FIELD OF THE DISCLOSURE

The present embodiments relate to a plasma processing apparatus, and more particularly, to an apparatus for improved generation of high angle ion beams.

BACKGROUND OF THE DISCLOSURE

Known apparatus used to treat substrates with ions include beamline ion implanters and plasma immersion ion implantation tools. These approaches are useful for treating substrates with ions over a range of energies. In beamline ion implanters, ions are extracted from a source, mass analyzed and then transported to the substrate surface. In plasma immersion ion implantation apparatus, a substrate is located in the same chamber while the plasma is generated adjacent to the plasma. The substrate is set at negative potential with respect to the plasma, and ions crossing the plasma sheath in front of the substrate may impinge on the substrate at a perpendicular incidence angle.

Many of such approaches employ perpendicular incidence on a substrate or wafer, while other application employ angled etching such as controlled etching of trench sidewalls, hole elongation, photoresist shrinking, and magnetic random memory structures etching, where ion beams are defined by a non-zero mean angle of incidence with respect to the perpendicular to the substrate. Control of such processes may be more difficult than control of ion beam processing at normal incidence.

It is with respect to these and other considerations, the present disclosure is provided.

BRIEF SUMMARY

In one embodiment, an extraction plate for an ion beam system is provided. The extraction plate may include an insulator body that includes a peripheral portion, to connect to a first side of a plasma chamber, and further include a central portion, defining a concave shape. As such, an extraction aperture may be arranged along a first surface of the central portion, where the first surface is oriented at a high angle with respect to the first side. The extraction plate may further include a patterned electrode, comprising a first portion and a second portion, affixed to an outer side of the insulator body, facing away from the plasma chamber, wherein the first portion is separated from the second portion by an insulating gap.

In another embodiment, an ion beam processing apparatus is provided. The apparatus may include a plasma chamber, and a process chamber, adjacent to the process chamber, where the process chamber includes a substrate stage, defining a substrate plane. The apparatus may also include an extraction plate, disposed along a side of the plasma chamber, facing the substrate stage. The extraction plate may include an insulator body that has a peripheral portion, connected to a first side of the plasma chamber; and a central portion, defining a concave shape. The extraction aperture may be arranged along a first surface of the central portion, the first surface being oriented at a high angle with respect to the first side of the plasma chamber.; the extraction plate may also include a patterned electrode, comprising a first portion and a second portion, affixed to an outer side of the insulator body, facing away from the plasma chamber, wherein the first portion is separated from the second portion by an insulating gap.

BRIEF DESCRIPTION OF THE DRAWINGS

The accompanying drawings illustrate exemplary approaches of the disclosed embodiments so far devised for the practical application of the principles thereof, and wherein.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, apparatuses, and systems including high angle extraction optics are disclosed in accordance with the present disclosure and with reference to the accompanying drawings, where embodiments are shown. The embodiments may be embodied in many different forms and are not to be construed as being limited to those set forth herein. Instead, these embodiments are provided so the disclosure will be thorough and complete, and will fully convey the scope of methods, systems, and devices to those skilled in the art.

In various embodiments, extraction optics, including extraction plates, and processing systems are provided to generate high angle of incidence ("high angle") ion beams from a plasma-type ion source. Such extraction assemblies are suitable for use in compact ion beam processing apparatus, where a substrate is maintained in close proximity to a plasma chamber, from which chamber an ion beam is extracted. The substrate may be located in a housing or processing chamber, adjacent the plasma chamber, and in communication with a plasma in the plasma chamber through the extraction assembly. In various embodiments, ion extraction optics facilitate extraction of ions beamlets having extremely high (>65 degrees with respect to normal) on-wafer incidence angles. Said differently, the ion extraction optics of the present embodiments provide ion beams at glancing angles of incidence with respect to a main plane of a substrate, within a compact ion beam system. In various embodiments, an extraction plate is provided to withstand the harsh environment generated by chemically reactive plasmas.

Various embodiments provide an extraction plate suitable for use in a compact ion beam system. The extraction plate may be constructed to have an insulator body including a peripheral portion that couples to a plasma chamber, and has a central portion, or recessed portion, that has a concave shape, or "pocket shape." The central portion may define several surfaces, including one or more angled surfaces that include an extraction aperture to generate a high angle ion beam. In addition, the extraction plate may include a patterned electrode, affixed to the outer surface of the insulator body, and used to modify the extracted high angle ion beams. As detailed below, the patterned electrode may include multiple portions that are separated by gaps, where the location and size of the gaps helps determine the manner and extent of modification of the extracted ion beam. In particular embodiments, the patterned electrode may be printed as an electrically conductive film on the outer surface of the insulator body 104, and then covered with a protective layer of chemically inert dielectric material. In different non-limiting embodiments, the patterned electrode 110 may have a thickness of 10 μm to 100 μm. In different non-limiting embodiments, the protective layer 116 may have a thickness of 10 μm to 100 μm.

Figure 1A:
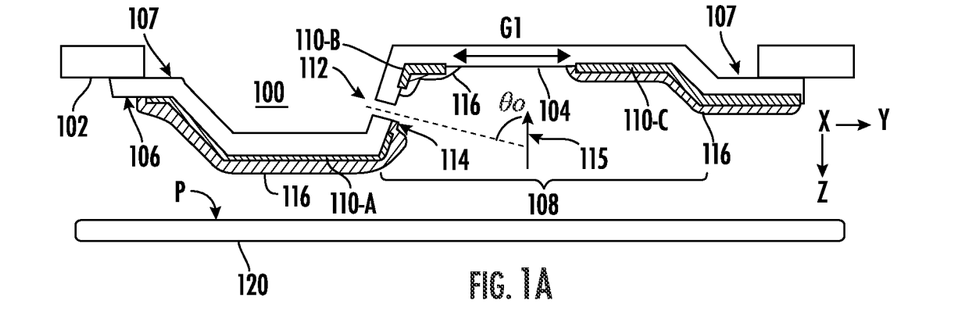
FIG. 1A shows a side cross-sectional view of an extraction plate including a high angle extraction assembly in accordance with various embodiments of the disclosure.
Figure 1B:
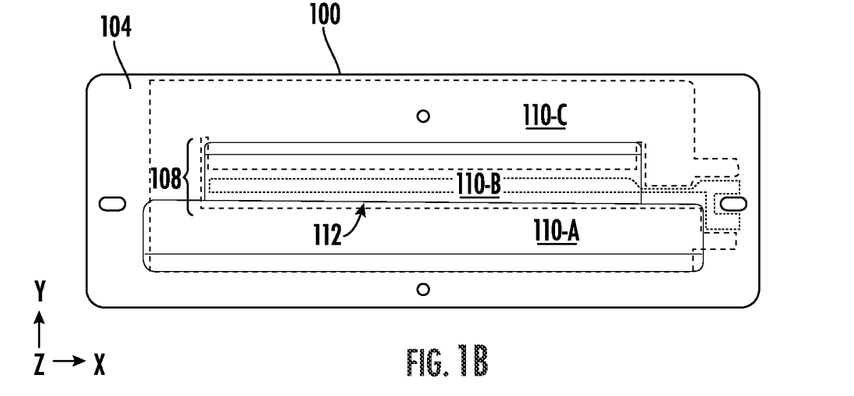
FIG. 1B shows a front view of an extraction plate including a high angle extraction assembly in accordance with various embodiments of the disclosure.
Figure 1C:
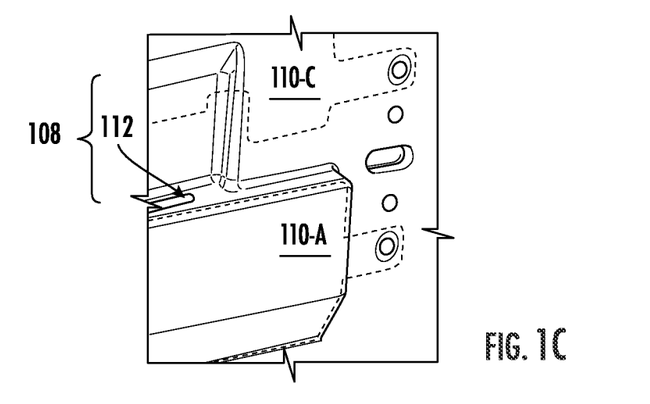
FIG. 1C shows a to perspective view of an extraction plate including a high angle extraction assembly in accordance with various embodiments of the disclosure.

Turning now to FIG. 1A there is shown a side cross-sectional view of an extraction plate 100, including a high angle extraction optics in accordance with various embodiments of the disclosure. FIG. 1B shows a front view of a variant of the extraction plate 100 including a high angle extraction assembly in accordance with various embodiments of the disclosure. FIG. 1C shows a closeup perspective view of a portion of the extraction plate 100 of FIG. 1B. This design is appropriate for treating substrates having 3D structures because an ion beam extracted through this extraction plate may treat just one sidewall or side of a surface feature in particular. However, provided with substrate rotation, multiple sides of a surface feature may be treated by rotating a substrate between scans of the substrate.

The extraction plate 100 is shown affixed to a plasma chamber 102 at outer portions of the extraction plate 100, where a plasma will generally be formed above the extraction plate 100, with a substrate 120 positioned below the extraction plate 100. The extraction plate 100 includes an insulator body 104, formed of a suitable material, such as quartz, alumina, or other dielectric ceramic, according to different embodiments. The extraction plate 100 also defines a recessed portion 108 that has a pocket or concave shape. In the embodiment of FIG. 1A, the extraction plate includes an extraction aperture 112, arranged perpendicular to a surface 114. The symmetry axis of the extraction aperture 112 may form a geometrical angle of incidence (shown as Co) with respect to a perpendicular 115 to a main plane P of the substrate 120, such as the X-Y plane of the Cartesian coordinate system shown. In other words, if an ion extracted from aperture 112 travels in a perfectly straight line the ion will intersect he substrate at $\theta_0$. As such, the extraction aperture 112 may define an angle of 65 degrees, 75 degrees, 80 degrees, 85 degrees with respect to the perpendicular 115. Thus, an ion beam extracted from the extraction aperture 112 will define a relatively glancing incidence with respect to the plane P of the substrate 120, where this glancing incidence, such as greater than 45 degrees with respect to the perpendicular 115, may be referred to herein as "high angle" or "high angle of incidence."

The extraction plate 100 may have a peripheral portion 107, for connecting to the plasma chamber 102, and a central portion, referred to as a recessed portion 108. As further shown in FIG. 1A (and also in FIG. 1D), the extraction plate 100 may include a patterned electrode 110, affixed to the outer surface 106 of the insulator body 104. The patterned electrode 110 may be fabricated of any suitable electrically conductive material, such as an elemental metal, metal alloy, and so forth. According to different embodiments, the patterned electrode 110 may be printed onto the outer surface 106, such as by a flame torch, electrodeposition, plasma spray, evaporation, or other suitable method. The patterned electrode 110 may extend at least in part over the recessed portion 108, and may be formed into different portions, such as portion 110-A, portion 110-B, and portion 110-C, depicted in FIG. 1A. According to various embodiments of the disclosure, different portions of the patterned electrode 110 may be physically connected to one another or electrically connected to one another. In other embodiments, different portions of an electrode, such as patterned electrode 110 may be physically separated from one another, and/or may be electrically isolated from one another.

In optional embodiments, as depicted in FIG. 1A, a protective layer 116 may be formed over the electrode 110, such as an electrically insulating layer that is chemically inert to etchant species generated by the plasma, such as atomic and molecular ions, radicals and photons.

In the embodiment of FIG. 1B, the patterned electrode 110 is formed in three portions, where the portion 110-A and portion 110-C are connected to one another, while the portion 110-B is not physically connected to the portion 110-A or portion 110-C. As such, the portion 110-A and portion 110-C may be connected to the same electrical potential (voltage), while the portion 110-B may or may not be connected to the same electrical potential as the portion 110-A and portion 110-C. In one implementation, electrical connection of the biasing voltage is at one end connected to the portion 110-A, while the readback of the voltage is at the other end, portion 110-C. In such a fashion a discontinuity in the electrical path can be readily diagnosed. In particular, the provision of terminals at the extremities of the electrode portions that act as bias and readback terminal functions provide convenient real time checking of the electrical continuity of the given electrode.

Because the portion 110-B is not connected to the portion 110-A and portion 110-B, in some implementations, the portion 110-B may be independently biased using a secondary bias voltage source, for example, at a different potential than the substrate 120, to further shape the extracted ion beam angular distribution.

As further shown in FIG. 1B, the extraction aperture 112 may be elongated along the X-direction, where the dimension of the aperture length along the X-direction may be at least 300 mm in some embodiments, or at least 400 mm in other embodiments, and may have an aperture width along the Y-direction of 2 mm-6 mm in non-limiting embodiment, so as to define a ribbon ion beam when ions are extracted therethrough.

Figure 1D:
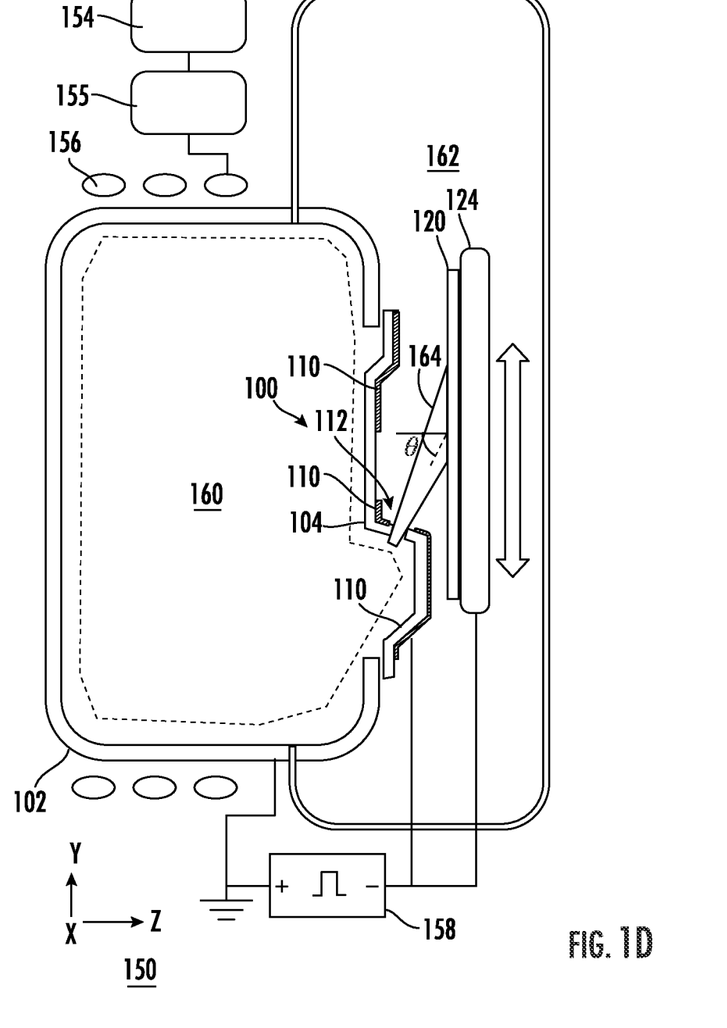
FIG. 1D shows block diagram of a processing apparatus including a high angle extraction assembly in accordance with various embodiments of the disclosure.

FIG. 1D shows block diagram of a processing apparatus 150 including a high angle extraction assembly in accordance with various embodiments of the disclosure. In this embodiment, the extraction plate 100 is coupled to the plasma chamber 102. An rf power generator 154 may be coupled to the plasma chamber, through an impedance matching network 155 and an rf antenna 156, to generate a plasma 160 therein. The plasma chamber 102 may function as part of a plasma source such as an RF inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment shown in FIG. 1D, the plasma source is an ICP source where the power from an RF power generator 154 is coupled into the plasma through an impedance matching network 155. The transfer of the RF power from the RF generator to the gas atoms and/or molecules takes places through an rf antenna 156 and a dielectric window (not shown).

As known in the art, a gas manifold (not shown) may be connected to the plasma chamber 102 through appropriate gas lines and gas inlets. The plasma chamber 102 or other components of the processing apparatus 150 also may be connected to a vacuum system (not shown), such as a turbo molecular pump backed by a rotary or membrane pump. The plasma chamber 102 is defined by chamber walls, and may be arranged adjacent to a process chamber 162, electrically insulated or not from the plasma chamber 102. The process chamber 162 may include a substrate holder 124 and the wafer or substrate 120.

In some embodiments, the substrate 120 and/or the substrate holder 124 may be held at negative potential using a bias voltage supply 158, while the plasma chamber 102 is grounded. For example, the substrate 120 (or substrate holder 124) may be pulsed at high negative voltage such as −1000 V (the extraction voltage), while the plasma chamber 102 and process chamber 162 may be grounded. Alternatively, the plasma chamber 102 may be pulsed at high positive voltage whereas the process chamber 162, the substrate 120, and the substrate holder 124 may be grounded. Pulsing extraction is useful for charge neutralization at the substrate surface. In various embodiments, the bias voltage supply 158 provides voltage pulses of 20 kHz-50 kHz frequency at variable duty cycle between 0-100%. In some embodiments the bias voltage supply 158 may also electrically couple the patterned electrode 110 to provide the same bias voltage as the substrate holder 124, and thus the substrate 120.

In these scenarios, positive ions may be extracted from the plasma 160 and directed to the substrate 120 as a ribbon ion beam at an ion energy equal to the product between ion electrical charge and the potential difference between the plasma chamber 102 and the substrate 120. The extraction plate 100 is arranged to generate one ion beam, where the ion beam 164 has an average angle of incidence that defines a high angle of incidence (θ) with respect to a perpendicular 115 to a plane P of the substrate 120, as defined previously with respect to FIG. 1A. Examples of suitable values for θ are between 60 degrees and 85 degrees according to various non-limiting embodiments, and more particularly between 65 degrees and 80 degrees. Such high angles are suitable for processing features in a substrate 120, such as sidewalls of a 3D structure.

As depicted in FIG. 1A, the axis of the extraction aperture 112 is oriented at a geometrical (natural) angle $\theta_0$ relative to the normal on substrate or z-axis. The electric field strength and orientation within the extraction region, i.e., in the space between extraction plate 104 and the substrate 120 may tilt the ion beam 164 from the geometrical angle $\theta_0$ to a smaller angle θ (as shown in FIG. 1D). The strength and orientation of the electric field in the extraction region is set by the extraction voltage, the distance between the extraction aperture 112 and the substrate, and the topology of electrically conductive surfaces bordering the extraction region. To suitably control the ion beam 164 angular distribution, i.e., the mean angle θ and angular spread Δθ, the patterned electrode 110 may be biased so as to modify the orientation of the electric field and thus to alter ion beam 164 trajectory (or, to alter trajectories of the ions in the ion beam 164).

The present inventors have discovered that the surface topology of the patterned electrode 110 will help determine various properties of an ion beam extracted through the extraction aperture 112, including the ion angular distribution (IAD) of the extracted ion beam, as well as the size or footprint of the extracted ion beam on the substrate 120. Moreover, by adjusting the surface topology as well as the bias voltage applied to the patterned electrode 110, the mean angle θ and angular spread Δθ of the ion beam may be tailored after exiting an extraction aperture. Especially at high angles of incidence, precise control of the mean angle of incidence, as well as IAD may be called for.

Figure 1E:
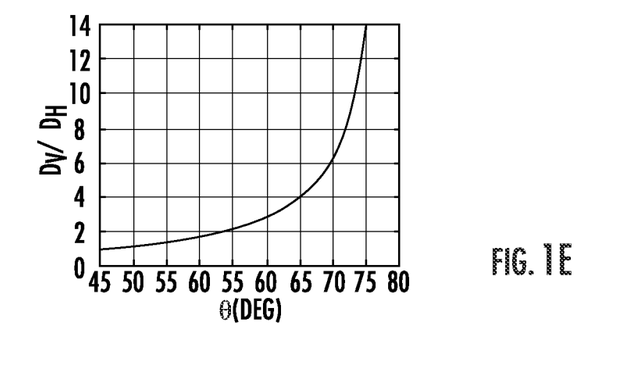
FIG. 1E shows vertical to horizontal sputter etch ratio due to ion beam bombardment on a 3D structure as a function of the angle of incidence (relative to the normal on the horizontal surface)

FIG. 1E shows the variation of ion dose ratio with angle variation for high angle of incidence treatment of a surface by an ion beam. More quantitatively, FIG. 1E shows how $D_V$ (ion dose on vertical surface)/$D_H$ (ion dose on horizontal surface) varies with ion beam incidence angle on substrate 0. For applications such as ion assisted etching of 3D structures to etch more on a vertical surface (trenches walls) is useful, while etching as little as possible on horizontal surfaces (where is located the etch mask). Considering just a physical etching (sputtering) component, the etch rates on respective surfaces will be proportional to the number of ions arriving on those surfaces per unit time, i.e., ion dose. The ion dose a on a vertical surface ($D_V$) is tan θ times the ion dose on a horizontal surface ($D_H$). Thus, FIG. 1E shows that varying θ from 75 degrees to 85 degrees will increase the dose ratio on a vertical (parallel to the Z-axis) surface to a horizontal surface (perpendicular to the z-axis) by more than a factor of three. Accordingly, precise control of mean angle and angular spread at high mean angle allows to control the relative ion flux on vertical versus horizontal surfaces.

Figure 2A:
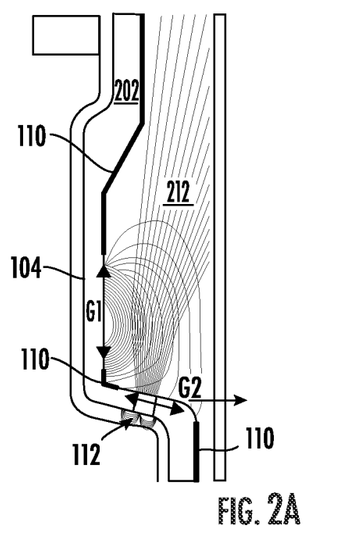
FIGS. 2A-2D shows simulations of electrostatic fields and ion beam geometry generated by various extraction plates, arranged according to various embodiments of the disclosure.

FIGS. 2A-2D shows simulations of electrostatic fields and ion beam geometry generated by various extraction plates, arranged according to various embodiments of the disclosure. The extraction plates 202-208 are generally arranged as variants of the extraction plate 100, described above. In FIG. 2A an extraction plate 202 includes the patterned electrode 110 where various portions (see portion 110-A, portion 110-B, portion 110-C, described previously) are separated by gaps where the outer surface 106 represents an uncoated surface, meaning an outer surface region having no electrode thereon. The geometrical extraction angle through extraction aperture 112 is 80 degrees. In FIG. 2A, the value of gap G1 (corresponding the gap between portion 110-B and portion 110-C) is 27 mm, in FIG. 2C, the value of gap G1 is 30 mm, in FIG. 2C, the value of gap G1 is 33 mm, while in FIG. 2D, the value of gap G1 is 30 mm, but the value of the gap G2 (corresponding the gap between portion 110-B and portion 110-A), surrounding the extraction aperture 112, is much less than (compare ~18 mm to ~10 mm) in the other configurations. The simulation was conducted with an extraction voltage 1.5 kV, a "z-gap" of 15 mm, meaning the distance between the center of the extraction aperture 112 and substrate 120 along the Z-axis, and an rf power applied to the plasma source of 600 W. In addition, the patterned electrodes 110 are biased at the same voltage as the substrate 120 (extraction voltage). Having the extraction plate electrodes and the substrate at the same electrostatic potential means there is no electric field between the plasma chamber 102 and the substrate in those regions. However, uncoated surfaces of the insulator body 104, such as in G1 and G2, are transparent to electrostatic potential lines (shown as the curves emanating from the insulator body 104), such that and electric field will leak in the extraction region. The strength and orientation of the electric field (which field is equal to the gradient of the potential lines) is set by the magnitude of bias voltage and electrode topology, meaning the shape, size, relative position of the electrodes along the outer surface of the extraction plate insulator body. Because the electric field is oriented from the plasma chamber 102 toward the substrate, this field ensures extraction of positive ions of a certain energy and certain ion angular distribution (mean angle and angular spread). As shown in FIG. 2A, for example, a group of electric field lines bow out generally from the gap G1, formed in the recessed portion 108, to the left of the extraction aperture 112 as viewed in FIG. 1. The ion beam 212 is generally deflected from an initial trajectory upon exit of the extraction aperture 112, such that the final average trajectory is bent toward the right in the figure.

Figure 2B:
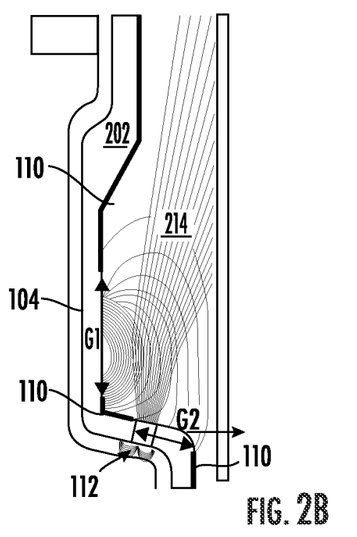
Figure 2C:
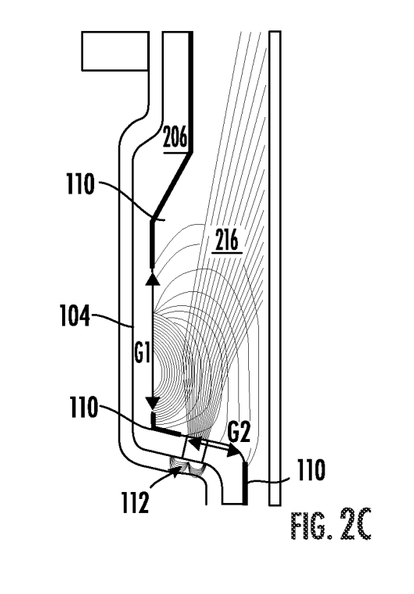
Figure 2D:
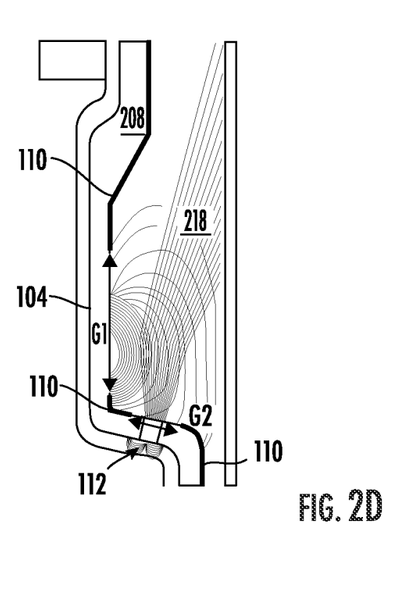
Figure 3A:
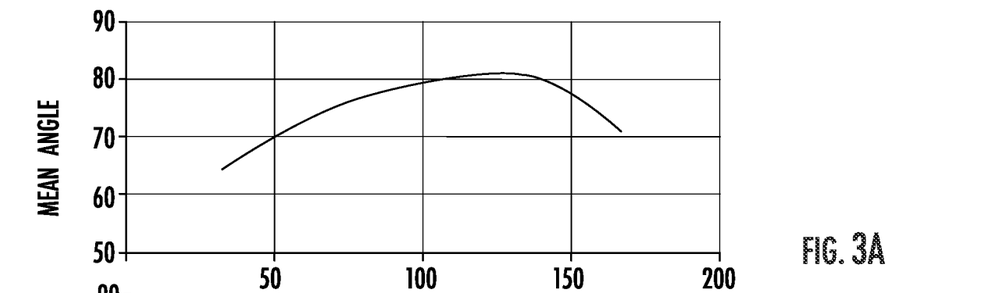
FIGS. 3A-3D shows simulations of mean angled of ion beams generated according to extraction plates, arranged according to various embodiments of the disclosure.
Figure 3B:
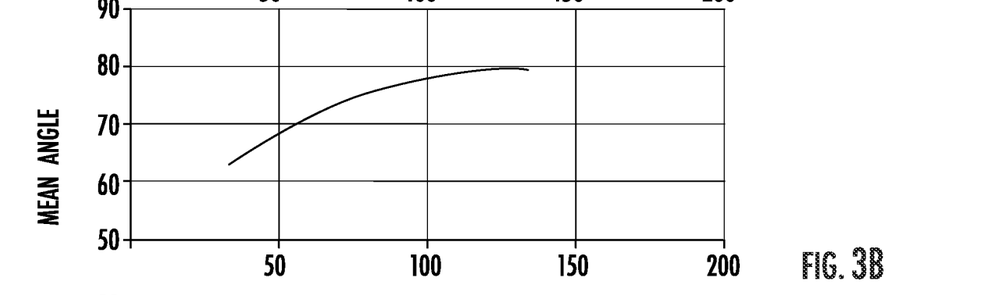
Figure 3C:
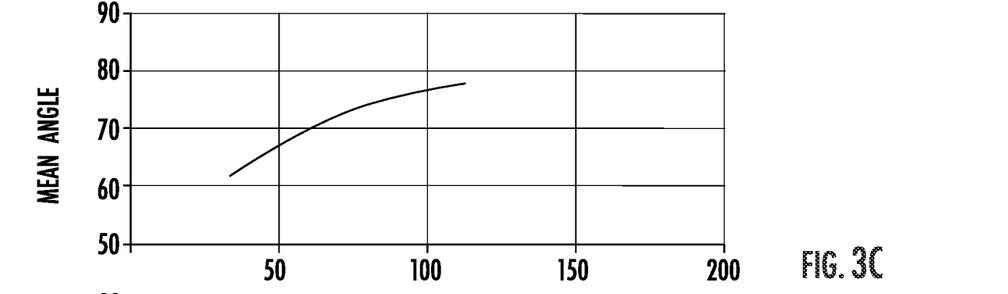
Figure 3D:
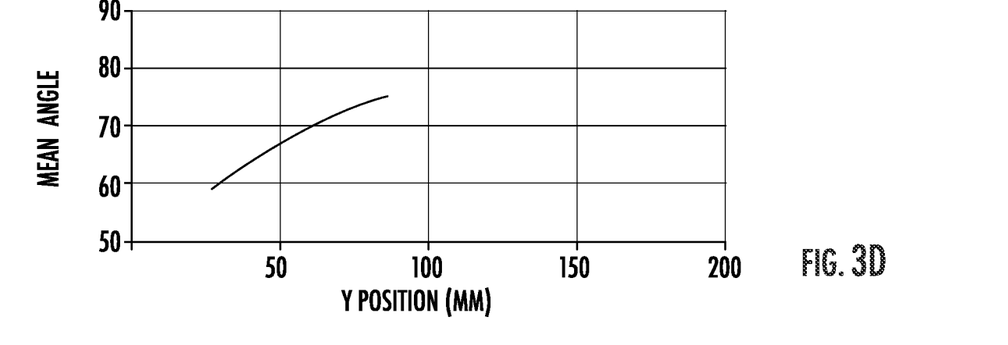
Figure 4A:
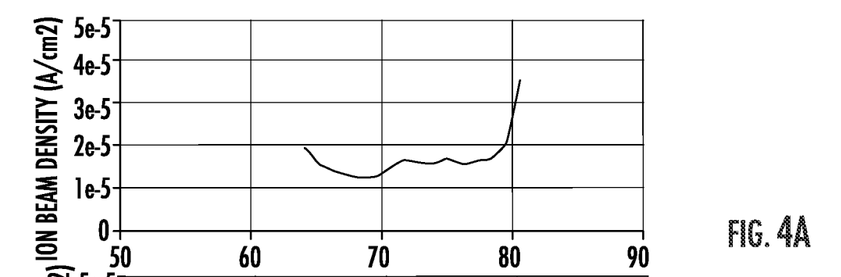
FIGS. 4A-4D shows simulations of ion angular distribution of ion beams generated according to extraction plates, arranged according to various embodiments of the disclosure.
Figure 4B:
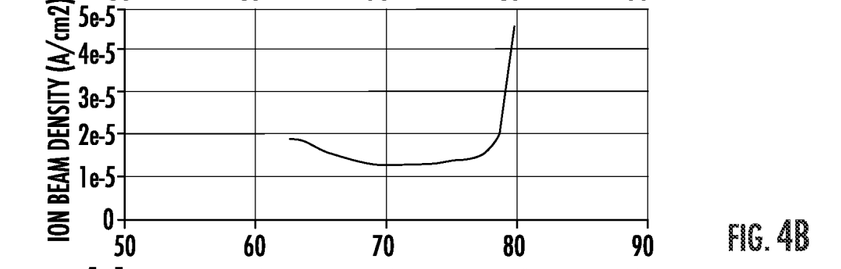
Figure 4C:
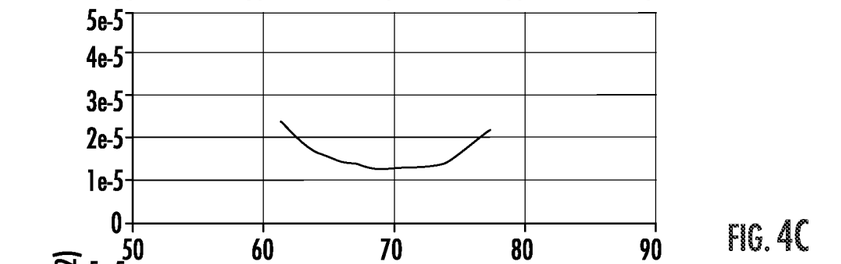
Figure 4D:
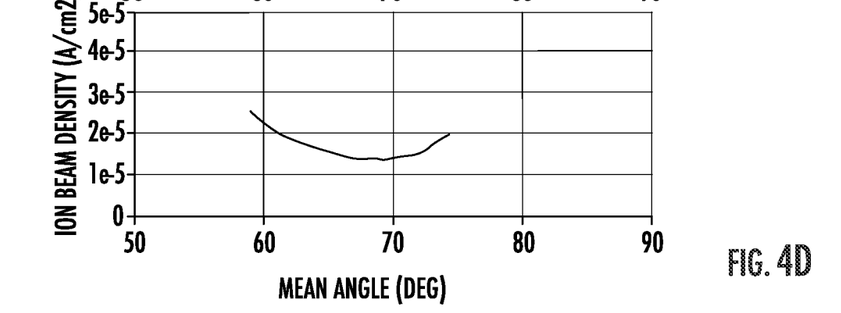

As evident from perusal of FIGS. 2A-2C, changing the size of the gap G1 changes the geometry of the ion beam produced. The trends shown in FIGS. 2A-2C can be explained as follows: As the size of the gap G1 increases, the size of the transparent region increases, with a result that the equipotential lines distribution in the gap between the extraction plate (202, 204, 206) and the substrate 120 sharpens, and as a result the vertical component of the electric field increases and consequently the ion beam (212, 214, 216) becomes increasingly tilted away from the imaginary geometrical trajectory upon exiting the extraction aperture 112. Furthermore, the angular spread decreases resulting in a reduced footprint of the ion beam on the substrate. In FIG. 2D, the addition of a portion of patterned electrode 110 near the extraction aperture 112 to reduce the value of G2 causes the equipotential lines to curve even more, resulting in even bigger vertical component of the electric field, and leading to more bending of the ion beam 218, and therefore a still smaller footprint on the substrate.

FIGS. 3A-3D shows graphs (emissivity curves) based upon simulations of ion angular distribution of ion beams generated according to extraction plates, arranged according to various embodiments of the disclosure. The modelling of ion extraction optics is for a plasma density corresponding to an input rf power of 600 W, extraction voltage of 1.5 kV, and z gap of 15 mm, but different topologies of electrodes, according to the FIGS. 2A-2D. Thus the graph of FIG. 3A corresponds to FIG. 2A, the graph of FIG. 3B corresponds to 2B, etc. The emissivity curves plot mean angle as a function of Y-position along the substrate. These curves show divergent beams having mean angles monotonically decreasing from 72 deg to 68 deg as going from configuration depicted in FIG. 2A to configuration depicted in FIG. 2D. As the size of G1 increases, the mean angle decreases slightly. For configurations shown in FIGS. 2A-2B, the emissivity curves show maxima, wherein for the configuration of FIG. 2A means an angle of 81 deg and for the configuration of FIG. 2B of 80 deg. This circumstance happens because the top portion of the beam crosses a region where the electrostatic field distribution is altered by the presence of the grounded housing of plasma chamber 102. The effect of adding an electrically biased electrode in the configuration of FIG. 2D leads to more bending of the given ion beam. Simultaneous with the mean angle decrease, the on-wafer beam footprint decreases as well: from 130 mm in the case corresponding to FIG. 2A, to 105 mm, 90 mm, and 65 mm, corresponding to configurations 2B, 2C, and 2D, respectively. While a higher mean angle is desirable, also a smaller footprint is desirable. A smaller footprint means a shorter scanning range for a given substrate, which circumstance translates into increased processing throughput.

FIGS. 4A-4D shows simulations of ion angular distribution of ion beams generated according to extraction plates, arranged according to various embodiments of the disclosure. The modelling of ion extraction optics is for a plasma density corresponding to an input rf power of 600 W, extraction voltage of 1.5 kV, and z gap of 15 mm, but different topologies of electrodes, according to the FIGS. 2A-2D. Thus the graph of FIG. 4A corresponds to FIG. 2A, the graph of FIG. 4B corresponds to 2B, etc. As shown in the figures depicting ion angular spread, this value changes just slightly between 15.5-17 deg, but not in a systematic manner as in the change of mean angle. Note that a change in the footprint of an ion beam will be a combined effect of reduced mean angle and reduced angular spread.

Figure 5A:
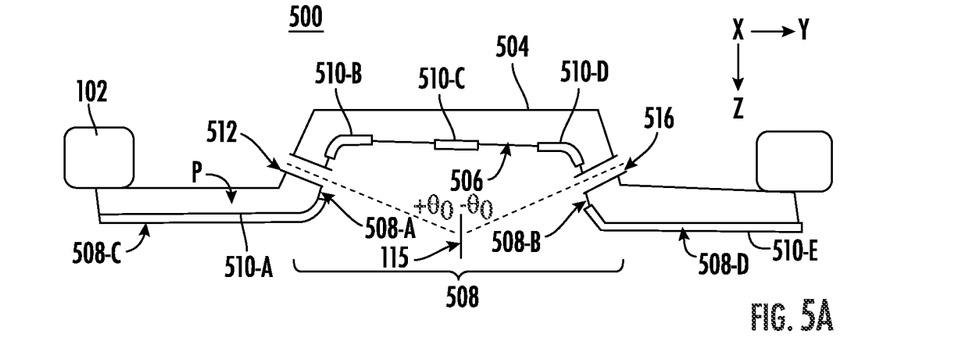
FIG. 5A shows a side cross-sectional view of another extraction plate including a high angle extraction assembly in accordance with various embodiments of the disclosure.
Figure 5B:
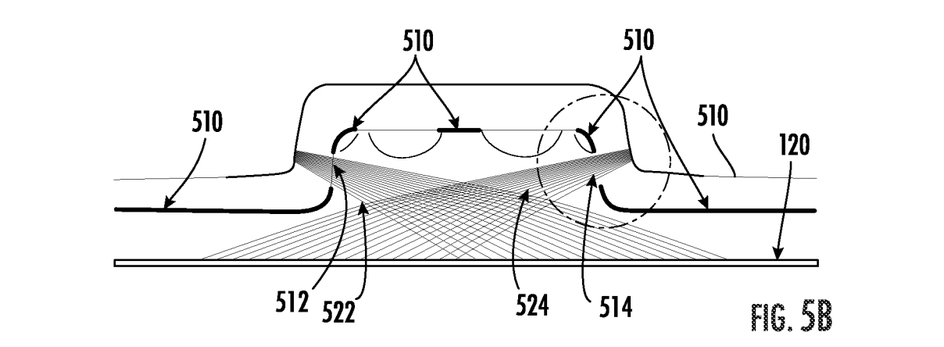
FIG. 5B shows a side cross-sectional view of simulations of electric field and ion beam geometry generated by a variant of the extraction plate of FIG. 5A.
Figure 5C:
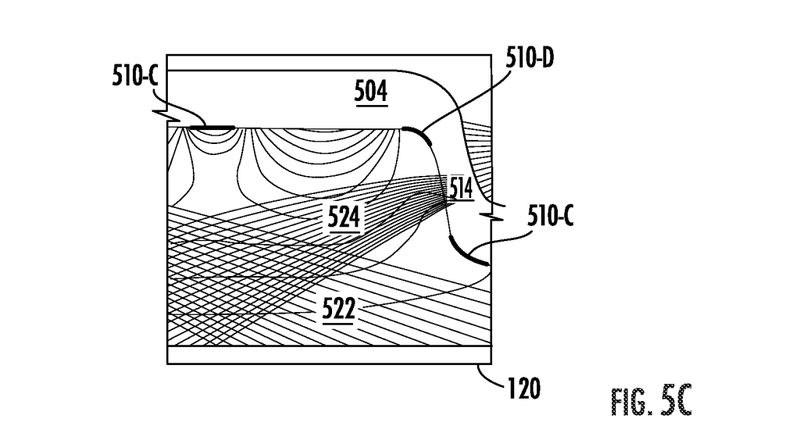
FIG. 5C shows details of the simulation of FIG. 5B.

FIG. 5A shows a side cross-sectional view of an extraction plate 500, including a high angle extraction assembly in accordance with various embodiments of the disclosure. FIG. 5B shows a side cross-sectional view of simulations of electrostatic equipotential lines distribution and ion beam geometry generated by a variant of the extraction plate of FIG. 5A. FIG. 5C shows details of the simulation of FIG. 5B. The extraction plate 500 includes an insulator body 504, and electrode 510, distributed in portions, on an outer surface 506 of the insulator body. As in the embodiment of FIG. 1A, a recessed portion 508 has a pocket or concave shape. The recessed portion 508 includes a first surface 508-A and a second surface 508-B, opposite the first surface, where a first extraction aperture 512 is located along the first surface 508-A and a second extraction aperture 516 is located along the second surface 508-B. These apertures may extend at high angles, such as between 60 degrees and 85 degrees, discussed previously with respect to FIG. 1A. In some variants, the first extraction aperture 512 and the second extraction aperture 516 comprise a symmetrical configuration, meaning that the two apertures define angles having the same absolute value with respect to the perpendicular 115 (see FIG. 1A), such as +/−70 degrees, +/−75 degrees, etc. Moreover, the first surface 508-A and second surface 508-B may be the same length, and the outer surface 508-C may be coplanar with the outer surface 508-D. Additionally, according to some embodiments, the different portions of electrode 510 may be arranged symmetrically, such as portion 510-A forming a mirror image with respect to portion 510-E, portion 510-B being a mirror image of portion 510-D, and portion 510-C being disposed midway between the first extraction aperture 512 and second extraction aperture 516.

As such, a pair of high angle ion beams may be generated, shown as ion beam 522 and ion beam 524. In the example of FIG. 5B, a bidirectional incidence of ions is provided with the geometrical angles of the two different ion beams defined by $+/-\theta_0$. While this configuration may not provide extraction of ion beams having mean angles as high as unidirectional extraction optics, this configuration provides twice the extracted ion beam flux and implicitly higher throughput. Also, because of the symmetry of the beamlets relative to the normal on the substrate, in applications where the ion beams are used for sidewall etching of a feature such as an array of narrow trenches, atoms that were sputtered by one beamlet (say ion beam 522) and were not pumped away, but redeposited on the opposite sidewall, will be resputtered by the symmetric beamlet (say ion beam 524). As in the case of FIG. 1A, in this embodiment, electric fields in the region between extraction plate 500 and substrate 120 are shaped by the topography of the electrode 510 and gaps between the portions of the electrode 510.

Figures 6A, 6B:
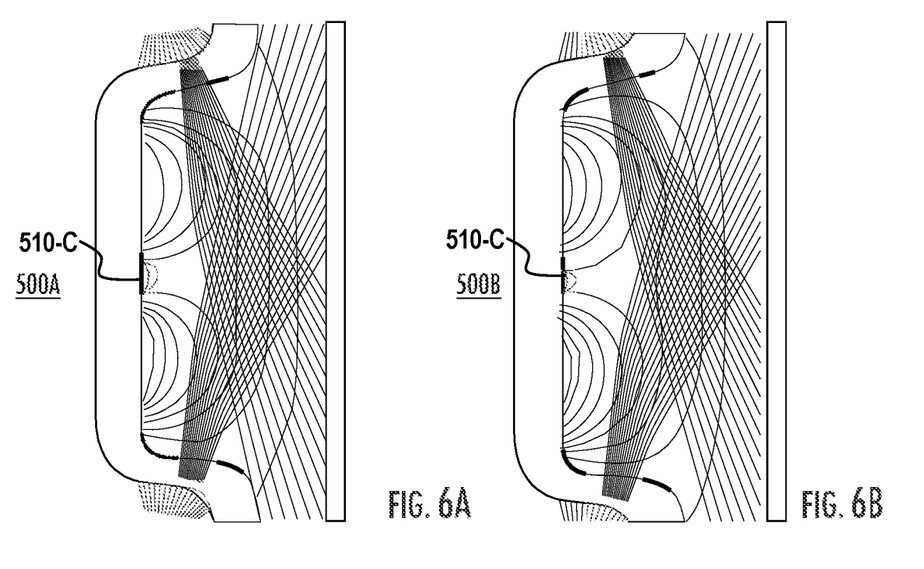
FIGS. 6A-6D shows simulations of electrostatic fields and ion beam geometry generated according to additional extraction plates, arranged according to various embodiments of the disclosure.

FIGS. 6A-6D shows simulations of electrostatic equipotential lines and ion beam geometry generated according to additional extraction plates, arranged according to various embodiments of the disclosure. For all the figures, the extraction voltage is 1.5 kV equal to biasing voltage, the rf power is 600 W and the z gap is 10 mm. The ion beam shape is shown for different electrode topologies. In FIG. 6A, the portion 510-C of extraction plate 500A has a height=5 mm, portions around the respective apertures of 0.5 mm; in FIG. 6B, the portion 510-C of extraction plate 500B has a height=5 mm, portions around the respective apertures of 3.5 mm; in FIG. 6C, the portion 510-C of extraction plate 500C has a height=10 mm, portions around the respective apertures of 3.5 mm; in FIG. 6D, the portion 510-C of extraction plate 500D has a height=10 mm, portions around the respective apertures of 3.5 mm, while the extraction plate 500D has a bowed shape in the region of the portion 510-C.

Figures 6C, 6D:
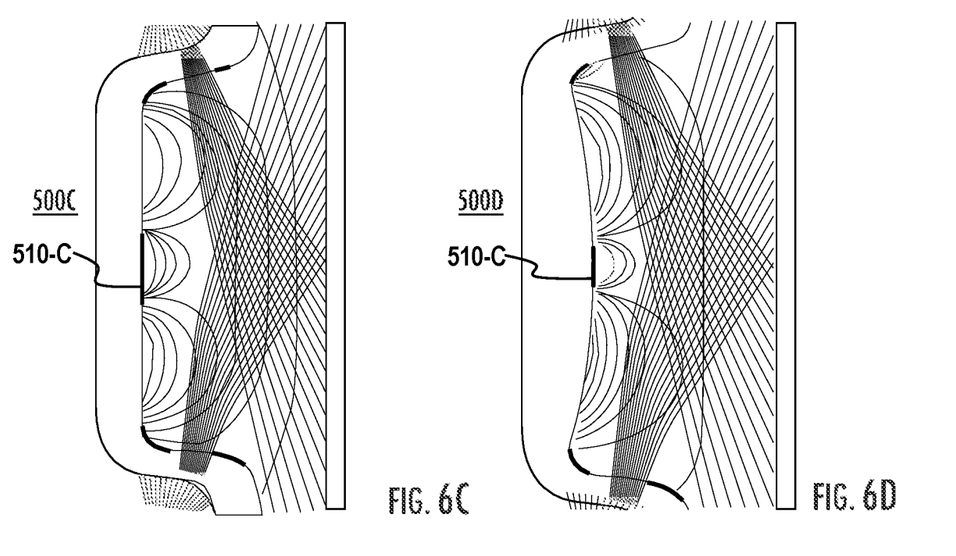

Corresponding emissivity curves were simulated where the configuration of FIG. 6A generated a mean angle of 66 degrees, FIG. 6B generated a mean angle of 68 degrees, FIG. 6C generated a mean angle of 70 degrees, and FIG. 6D generated a mean angle of 63 degrees. Corresponding ion angular distributions were simulated where the configuration of FIG. 6A generated an IAD of 12 degrees, FIG. 6B-FIG. 6D generated a IAD of 16 degrees.

Figure 7:
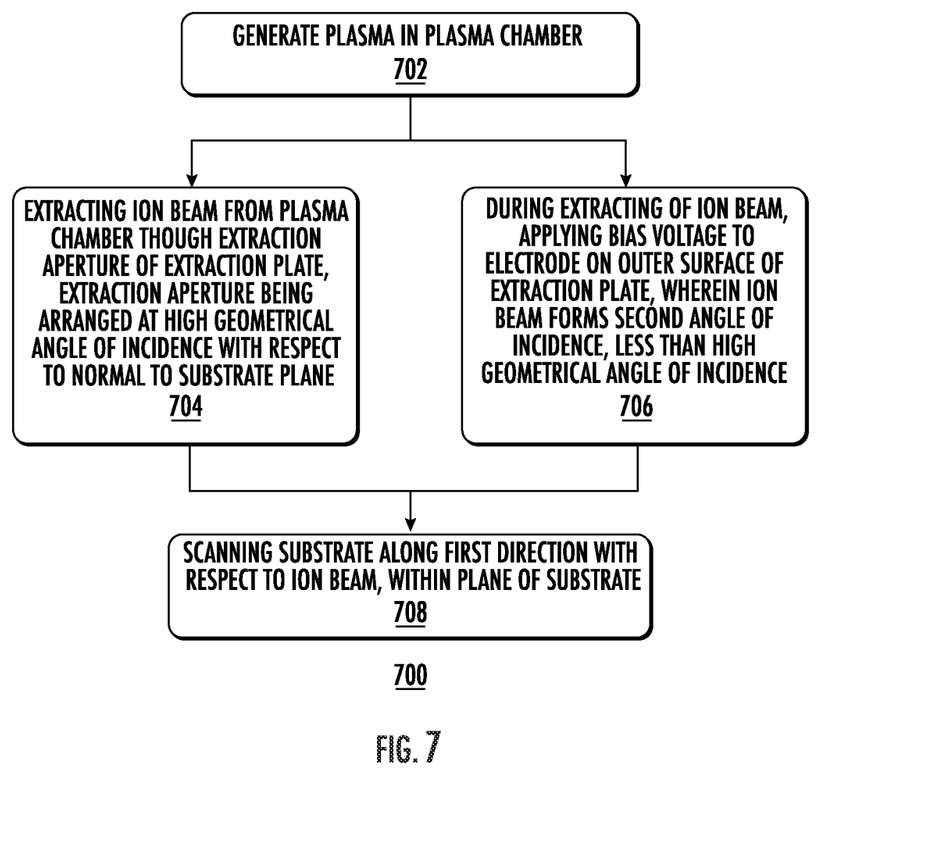
FIG. 7 shows an exemplary process flow.

FIG. 7 depicts an exemplary process flow 700. At block 702, a plasma is generated in a plasma chamber. The flow may then proceed to block 704 and block 706, where the different operations of block 704 and block 706 may be performed simultaneously to one another.

At block 704, an ion beam is extracted from the plasma chamber though an extraction aperture of an extraction plate where the extraction aperture is arranged at a high geometrical angle of incidence with respect to a normal to a substrate plane. The geometrical angle of incidence may be between 60 degrees and 85 degrees in various non-limiting embodiments.

At block 706, simultaneously with the application of the extraction voltage of block 704, a bias voltage is applied to an electrode disposed on an outer surface of extraction plate, wherein the electrode is arranged in a plurality of portions, separated by a gap, wherein the ion beam forms an angle of incidence, less than the geometrical angle of incidence. In some cases, the bias voltage of the electrode may be the same voltage as the substrate potential. In one example, where the substrate is biased negatively with respect to a plasma chamber, the electrode may be biased at potentials close to the substrate but different from the substrate, such as between +/−100 V, +/−200 V, with respect to substrate potential. The effect of the gap may be to generate electric fields that alter the mean angle of the ion beam after extraction. As such, the ion beam may form a second angle of incidence, less than high geometrical angle of incidence. More particularly, while the ion beam may define a high mean geometrical angle of incidence proximate the extraction aperture, in the region where the ion beam impinges on the substrate, the ion beam will define a second mean angle of incidence that is less than the high geometrical angle of incidence. In some non-limiting examples, the difference in the high mean geometrical angle of incidence and the second mean angle of incidence may be on the order of a few degrees, five degrees, ten degrees, or fifteen degrees.

Thus, an ion beam extracted at a high geometrical angle of incidence such as 80 degrees, may be shaped by the electric field generated by the voltage applied to the electrode to cause the ion beam to strike the substrate at a second angle of incidence of 75 degrees. As such, the ion beam may generate a footprint on the substrate (e.g., at 75 degrees incidence) that is less than a footprint when no bias voltage is applied to the electrode (e.g., 80 degrees incidence).

At block 708, the substrate is scanned along a first direction with respect to the ion beam, within the plane of the substrate.

In view of the above, the above embodiments provide apparatus and techniques to extract ion beams at as high angles as possible, while maintaining an acceptable beam footprint on a substrate, to shorten the substrate scanning range and thus to increase the throughput. Therefore, there is a trade-off between the high angle and the beam footprint. Moreover, the use of a biasing electrode that is characterized by an insulating gap between different portions, provides a means to guide the extracted ion beam at a relatively high average angle while preventing beam blow up, ensuring that the extracted ion beam just strikes targeted regions of the substrate. In addition, by providing a recessed geometry to locate at least a portion of the biasing electrode, a high angle ion beam may be extracted while not impacting the biasing electrode, or minimally impacting the biasing electrode.

In various additional embodiments, a separate biasing electrode, applying a second bias may be located on an outside surface of the extraction plate, and provide further control, including: reducing the on-wafer beam footprint; and providing tunability of the angular distribution of the extracted ion beam. This tunability feature may be especially useful during etching process of trench features, where, as the etch progresses toward the bottom of the trench, decrease in the average incidence angle of the ion beam may be needed, which decrease may be accomplished in situ by adjusting the second bias voltage during etching.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

In sum, the present embodiments provide novel apparatus and extraction assemblies that are generally arranged with one or more extraction plates having novel, non-planar geometries to provide extracted ion beams an high angles of incidence. Another advantage is the decoupling of the substrate from the extraction optics, which decoupling means there will be no process drift due to back streaming electrons generated by secondary electron emission due to bombardment of the substrate surface by ions. The present embodiments also mitigate metal contamination and allows control of the ion angular distribution of an ion beam in real time by adjusting voltage applied to the electrode(s) on the extraction aperture. The present embodiments also eliminate pressure variation during scanning of a substrate, and reduce plasma chamber contamination with etch byproducts, reduce particle generation, and when operated in differential biasing mode allows large angle tunability range for an ion beam.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An extraction plate for an ion beam system, comprising:
   an insulator body, having:
      a peripheral portion, the peripheral portion to connect to a first side of a plasma chamber; and
      a central portion, defining a concave shape, wherein an extraction aperture is arranged along a first surface of the central portion, the first surface being oriented at a high angle with respect to the first side; and
   a patterned electrode, comprising a first portion and a second portion, affixed to an outer side of the insulator body, facing away from the plasma chamber, wherein the first portion is separated from the second portion by an insulating gap.

2. The ion extraction plate of claim 1, comprising:
   a protective layer, disposed over the patterned electrode.

3. The extraction plate of claim 2, the protective layer comprising a thickness of 10 μm to 100 μm.

4. The extraction plate of claim 1, the patterned electrode comprising a thickness of 10 μm to 100 μm.

5. The extraction plate of claim 1, wherein the extraction aperture is elongated, wherein the extraction aperture defined an aperture length and an aperture width, wherein a ratio of the aperture length to the aperture width is greater than 100.

6. The extraction plate of claim 1, wherein the first surface defines an angle of 60 degrees or greater with respect to the first side.

7. The extraction plate of claim 1, wherein the extraction aperture is a first extraction aperture, wherein the central portion comprises a second surface, opposite the first surface, the second surface comprising a second extraction aperture, opposite the first extraction aperture.

8. The extraction plate of claim 7, wherein the first extraction aperture and the second extraction aperture comprise a symmetrical configuration.

9. An ion beam processing apparatus, comprising:
   a plasma chamber;
   a process chamber, adjacent to the process chamber, and including a substrate stage, defining a substrate plane; and
   an extraction plate, disposed along a side of the plasma chamber, facing the substrate stage, the extraction plate comprising:
   an insulator body, having:
      a peripheral portion, the peripheral portion connected to a first side of the plasma chamber; and
      a central portion, defining a concave shape, wherein an extraction aperture is arranged along a first surface of the central portion, the first surface being oriented at a high angle with respect to the first side; and
   a patterned electrode, comprising a first portion and a second portion, affixed to an outer side of the insulator body, facing away from the plasma chamber, wherein the first portion is separated from the second portion by an insulating gap.

10. The ion beam processing apparatus of claim 9, comprising:
    a protective layer, disposed over the patterned electrode.

11. The ion beam processing apparatus of claim 10, the patterned electrode comprising a thickness of 10 μm to 100 μm, and the protective layer comprising a thickness of 10 μm to 100 μm.

12. The ion beam processing apparatus of claim 9, wherein the extraction aperture is elongated, wherein the extraction aperture defined an aperture length and an aperture width, wherein a ratio of the aperture length to the aperture width is greater than 100.

13. The ion beam processing apparatus of claim 9, wherein the first surface defines an angle of 60 degrees or greater with respect to the first side.

14. The ion beam processing apparatus of claim 9, wherein the extraction aperture is a first extraction aperture, wherein the central portion comprises a second surface, opposite the first surface, the second surface comprising a second extraction aperture, opposite the first extraction aperture.

15. The ion beam processing apparatus of claim 14, wherein the first extraction aperture and the second extraction aperture comprise a symmetrical configuration.

16. The ion beam processing apparatus of claim 9, wherein an outer portion of the extraction plate and the substrate stage define a Z-gap between 5 mm and 30 mm.

17. A method of treating a substrate with an ion beam, comprising:
   forming a plasma in a plasma chamber, the plasma chamber having a first side;
   providing an extraction plate along the first side of a plasma chamber, wherein the extraction plate comprises: an insulator body and a patterned electrode, disposed on a surface of the insulator body; and
   extracting the ion beam from the plasma while applying a bias voltage to the patterned electrode,
   wherein the insulator body and the patterned electrode are shaped to extract the ion beam from the plasma and direct the ion beam to the substrate at a high angle with respect to a perpendicular to the first side.

18. The method of claim 17, wherein the bias voltage equal to an extraction voltage applied between the substrate and plasma chamber.

19. The method of claim 17, wherein the bias voltage equal being different than an extraction voltage applied between the substrate and plasma chamber.

20. The method of claim 17, wherein the modifying the varying a bias voltage is varied while scanning the substrate using the substrate stage.

\* \* \* \* \*